United States Patent [19]

Bhatnagar et al.

[11] Patent Number: 5,895,260

[45] Date of Patent: *Apr. 20, 1999

[54] METHOD OF FABRICATING SEMICONDUCTOR DEVICES AND THE DEVICES

[75] Inventors: Mohit Bhatnagar; Charles E. Weitzel, both of Mesa; Christine Thero, Scottsdale, all of Ariz.

[73] Assignee: Motorola, Inc., Schaumburg, Ill.

[*] Notice: This patent is subject to a terminal disclaimer.

[21] Appl. No.: 08/625,606

[22] Filed: Mar. 29, 1996

[51] Int. Cl.$^6$ .................................................. H01L 21/28

[52] U.S. Cl. .................... 438/571; 438/400; 438/406; 438/507

[58] Field of Search ................................. 438/400, 406, 438/507, 571

[56] References Cited

U.S. PATENT DOCUMENTS

| | | | |
|---|---|---|---|
| 5,378,642 | 1/1995 | Brown et al. | 437/40 |
| 5,612,232 | 3/1997 | Thero et al. | 437/39 |

*Primary Examiner*—Charles Bowers
*Assistant Examiner*—Reneé R. Berry
*Attorney, Agent, or Firm*—Robert F. Hightower; Eugene A. Parsons

[57] ABSTRACT

Fabricating a device including a Schottky diode by growing a dielectric film on a SiC substrate structure and forming an ohmic contact on the opposite surface of the substrate structure by depositing a layer of metal and annealing at a temperature above 900° C. Implanting doping material in the substrate structure through spaced apart openings to form high resistivity areas and depositing a dielectric layer on the dielectric film to define a contact opening positioned between the spaced apart high resistivity areas. Annealing the implant at a temperature less than approximately 400° C. to reduce reverse leakage current and depositing metal in the contact opening to form a Schottky contact.

16 Claims, 2 Drawing Sheets

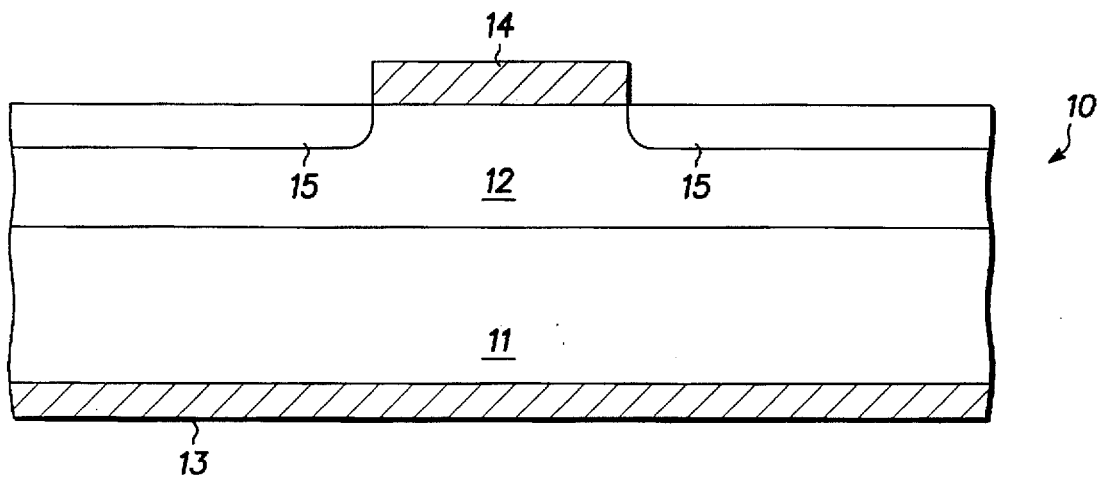
FIG. 1 - PRIOR ART -
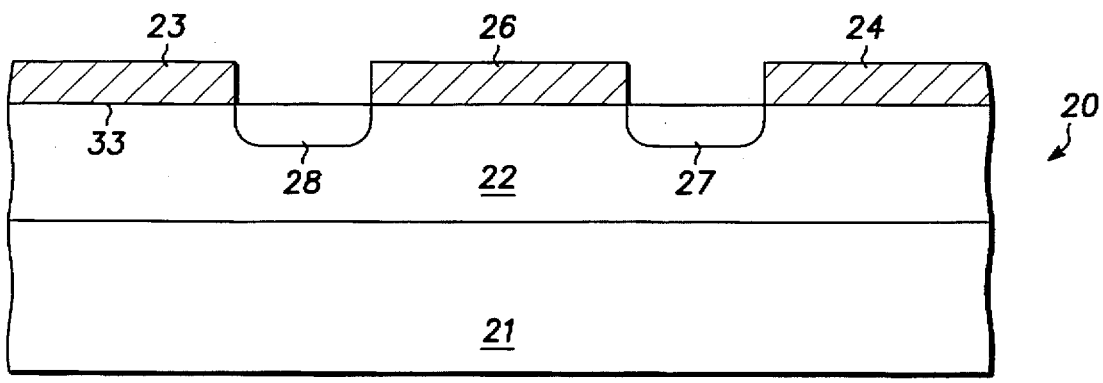
FIG. 2 - PRIOR ART -
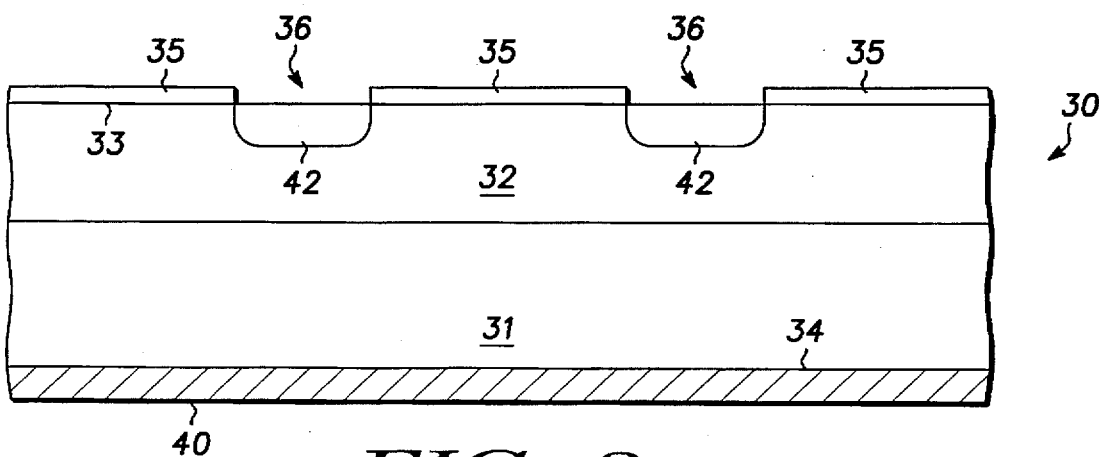
FIG. 3

METHOD OF FABRICATING SEMICONDUCTOR DEVICES AND THE DEVICES

FIELD OF THE INVENTION

The present invention pertains to methods of fabricating semiconductor devices and the devices and more specifically to methods of fabricating semiconductor devices including Schottky diodes, or contacts, and the Schottky diodes, or contacts.

BACKGROUND OF THE INVENTION

In the fabrication of semiconductor devices, it is known that damaging the substrate in an area surrounding the gate contact with implants of electrically inactive ions affects the electrical field along the surface of the substrate and, hence, the breakdown voltage of the device. See for example, U.S. Pat. No. 5,399,883, entitled "High Voltage Silicon Carbide MESFETS and Methods of Fabricating Same", issued Mar. 11, 1995. In all of these prior art devices, the damaged area extends at least from the gate electrode to the drain electrode, and in some devices the damage region also extends to the source electrode.

It is well known in the art that guard rings and the like can be diffused into the substrates of silicon semiconductor devices (and especially silicon power devices) for purposes of terminating or separating devices on a common substrate. However, devices formed on silicon carbide (SiC) substrates cannot be terminated using diffused guard rings because of the very small diffusion coefficients of conventional dopants in SiC. Use of field plates on SiC substrates is also limited since high electric fields in the dielectric and the subsequent breakdown of the dielectric is likely to occur before avalanche breakdown of the SiC.

However, all of these prior art devices, in actual practice, have relatively large reverse leakage current and a soft-breakdown. Accordingly, it would be highly advantageous to provide a method of fabricating semiconductor devices with an improved reverse breakdown characteristics.

It is a purpose of the present invention to provide a new and improved method of fabricating semiconductor devices.

It is another purpose of the present invention to provide a new and improved method of fabricating semiconductor devices including a Schottky diode or contact.

It is still another purpose of the present invention to provide a new and improved method of fabricating semiconductor devices including a Schottky diode or contact with improved reverse breakdown characteristics.

It is yet another purpose of the present invention to provide a new and improved method of fabricating semiconductor devices including a Schottky diode or contact on silicon carbide substrates with improved reverse breakdown characteristics.

It is a further purpose of the present invention to provide new and improved semiconductor devices including Schottky diodes or contacts.

It is still a further purpose of the present invention to provide new and improved semiconductor devices including Schottky diodes or contacts with improved reverse breakdown characteristics.

It is yet a further purpose of the present invention to provide new and improved semiconductor devices including Schottky diodes or contacts on silicon carbide substrates with improved reverse breakdown characteristics.

SUMMARY OF THE INVENTION

The above problems and others are at least partially solved and the above purposes and others are realized in a method of fabricating a semiconductor device including the steps of providing a semiconductor substrate structure having first and second surfaces and forming a dielectric film on the first surface of the substrate structure with spaced apart openings therethrough. Doping material is implanted in the substrate structure through the spaced apart openings to form spaced apart high resistivity areas. A dielectric layer is deposited on the dielectric film and a contact opening is formed through the dielectric layer and the dielectric film exposing a portion of the first surface of the substrate structure with the contact opening positioned at least partially between the spaced apart high resistivity areas. The doping material implanted in the substrate structure is annealed to reduce reverse leakage current and a metal contact is deposited on the first surface of the substrate structure through the contact opening in the dielectric layer and the dielectric film to form a Schottky contact.

The above problems and others are at least partially solved and the above purposes and others are further realized in a Schottky contact including a silicon carbide substrate structure having first and second surfaces with a dielectric film positioned on the first surface. Doping material is implanted in the substrate structure to form spaced apart high resistivity areas and a dielectric layer deposited on the dielectric film defines a contact opening through the dielectric layer and the dielectric film so as to expose a portion of the first surface of the substrate structure. The contact opening is positioned at least partially between the spaced apart high resistivity areas. Doping material implanted in the substrate structure and annealed at a temperature less than approximately 400° C. reduces reverse leakage current and metal deposited on the substrate structure through the contact opening in the dielectric layer and the dielectric film forms a Schottky contact.

BRIEF DESCRIPTION OF THE DRAWINGS

Referring to the drawings:

FIG. 1 is a simplified cross-sectional view of a typical prior art Schottky diode;

FIG. 2 is a simplified cross-sectional view of a prior art three terminal semiconductor device incorporating typical damaged areas;

FIGS. 3 through 5 are simplified cross-sectional views illustrating various steps in a fabrication process of a Schottky diode in accordance with the present invention.

DESCRIPTION OF THE PREFERRED EMBODIMENTS

Figure 4:
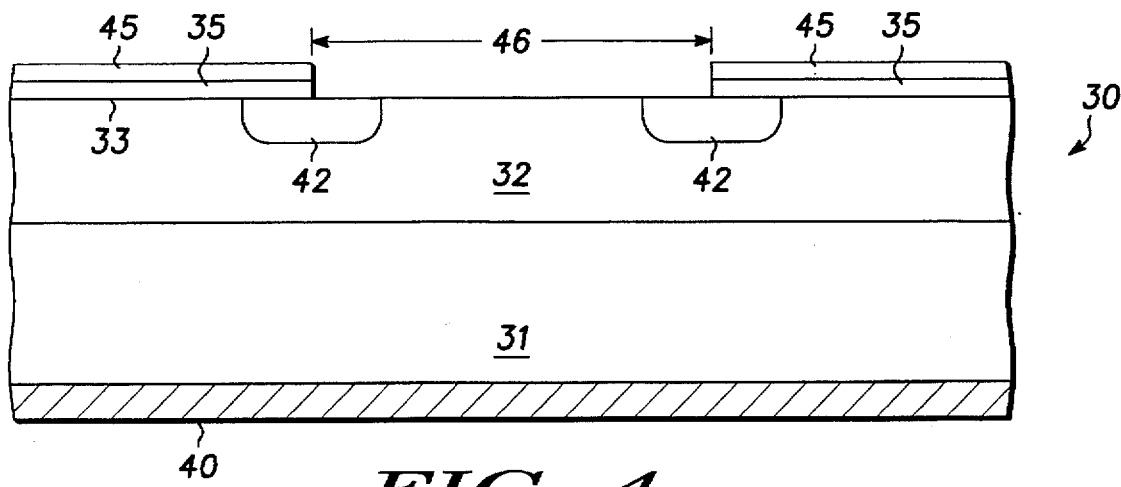

Referring specifically to FIG. 1, a simplified cross-sectional view of a typical prior art Schottky diode 10 is illustrated. Diode 10 includes a relatively heavily doped ($n^+$) substrate 11 having a lightly doped (n) layer 12 formed thereon. An ohmic contact 13 is formed on the lower, or reverse, side of substrate 11 by depositing a layer of an appropriate metal and annealing the metal at a temperature in excess of 900° C. to form the metal into ohmic contact 13. A Schottky metal 14 is deposited in an area chosen for the Schottky contact and a complete area 15 surrounding Schottky metal 14 is damaged by implanting an electrically inactive material, using Schottky metal 14 as a mask. As explained above, a major problem with this device and the semi-infinite damage region 15 is the very large reverse leakage current and soft-breakdown that results.

FIG. 2 illustrates a simplified cross-sectional view of a typical semiconductor transistor 20 that is formed on a semiconductor substrate 21. A low resistance channel layer 22 is epitaxially formed on substrate 21 to provide a low resistance path for current flow between a source contact 23 and a drain contact 24 that are formed on a surface of layer 22. Drain contact 24 is laterally displaced from source contact 23 and a Schottky gate 26 is positioned therebetween on channel layer 22. Transistor 20 also has a drain damage layer 27 and a source damage layer 28 that are used to increase the gate-to-drain and gate-to-source breakdown voltages, respectively, of transistor 20.

Damage layers 27 and 28 are areas where atoms are displaced from the lattice structure of layer 22. The displaced atoms become interstitial atoms that are randomly distributed within damage layers 27 and 28 and increase the resistance within damage layers 27 and 28. For example, typical semiconductor material such as GaAs or SiC has about $1\times10^{13}$ missing or interstitial atoms/cm$^3$. Layers 27 and 28 typically have greater than $1\times10^{20}$ interstitial atoms/cm$^3$. Layers 27 and 28 are created by implanting large inert ions into layer 22. The inert ions are intended to minimize electrical alteration on the material used for layer 22. Drain damage layer 27 extends laterally to contact 24 from an intersection of gate 26 and layer 22. Source damage layer 28 extends to source contact 23 from an intersection of gate 26 and layer 22.

Figure 5:
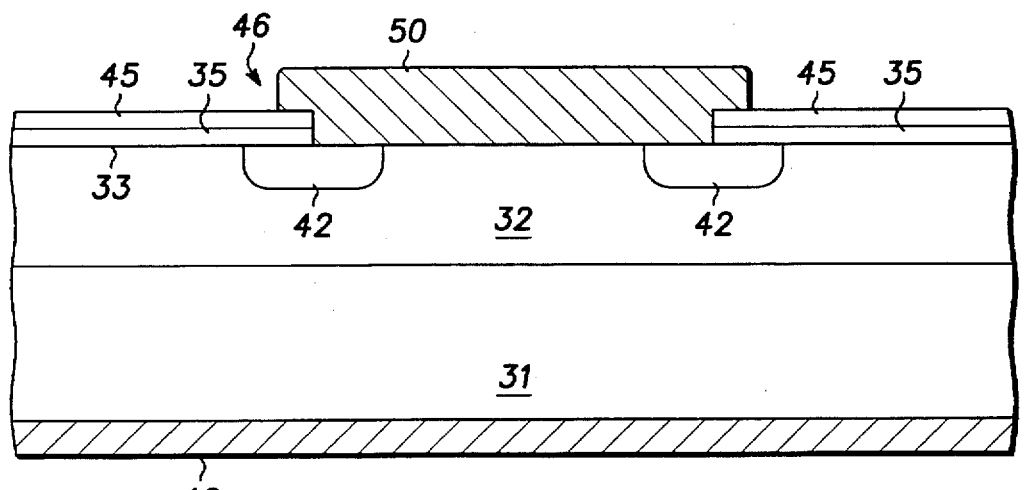

Referring now to FIGS. 3 through 5, simplified cross-sectional views are shown illustrating various steps in a fabrication process of a Schottky diode or contact in accordance with the present invention. Specifically, FIG. 3 illustrates a substrate structure 30 including a substrate 31 having a lightly doped layer 32 formed thereon by some convenient method, such as epitaxial growth. While substrate 31 and layer 32 might be a variety of different materials, in this specific example substrate 31 is formed of a relatively heavily doped (n$^+$) silicon carbide (SiC) while layer 32 is lightly doped (n) silicon carbide. For purposes of this disclosure the term "substrate structure" will be utilized to indicate a substrate and other layers (e.g. channel layers, barrier layers, matching layers, etc.) formed thereon. Substrate structure 30 has an upper surface 33 and a lower surface 34.

A dielectric film 35 (e.g. an oxide film) is formed on surface 33 of substrate structure 30 and patterned by any convenient semiconductor technique to define spaced apart openings 36 therethrough. Here it should be understood that in most devices openings 36 will in fact be a continuous ring defining a central area (which will eventually be a Schottky contact). However, to simplify the description of the drawings and because in some specific instances separate areas might be used, openings 36 will be described as "spaced apart openings" however it should be understood that the term "spaced apart" throughout this disclosure includes a continuous ring. In this specific embodiment a mask of photoresist is used along with a low power reactant ion etch. Generally, dielectric film 35 can be conveniently grown or deposited (especially on substrate structures of SiC and the like) using standard semiconductor techniques. In this specific embodiment, dielectric film 35 is grown to a thickness of approximately 500 angstroms.

An ohmic contact 40 is formed on surface 34 of substrate structure 30 by depositing a layer of metal and annealing the metal at a temperature above 900° C. For example, a layer of nickel (Ni) is deposited on surface 34 and annealed at a temperature of 950° C. to form an ohmic contact with substrate structure 30. It will of course be understood that the various steps of forming and patterning dielectric film 35 and the formation of ohmic contact 40 can be performed in any convenient order. Subsequent to the step of annealing ohmic contact 40, doping material is implanted in substrate structure 30 through spaced apart openings 36 in dielectric film 35 to form spaced apart high resistivity areas 42. In general, the doping material utilized is inert ions or other electrically inactive material such as argon, krypton, etc. The formation of areas 42 is performed after the annealing of ohmic contact 40 because the high anneal temperature may recrystallize the damaged structure in areas 42 to the point that they would no longer be highly resistive.

After the implant step, a dielectric layer 45 is positioned on dielectric film 35, as illustrated in FIG. 4, by any convenient technique, such as the deposition of a silicon nitride layer. It should be noted that dielectric film 35 forms a good base for dielectric layer 45 so that layer 45 can be conveniently and firmly affixed to the structure. In the spaced apart openings 36, dielectric layer 45 can simply be formed directly on surface 33. Dielectric layer 45 forms a field plate of the device and also acts to passivate the device. Thus, the better the bond between dielectric layer 45 and the material therebelow, the better the passivation. A contact opening 46 is formed through dielectric layer 45 and dielectric film 35 (if present), utilizing any standard semiconductor patterning technique, so as to expose a portion of surface 33 of substrate structure 30. Contact opening 46 is positioned at least partially between spaced apart high resistivity areas 42, and in this specific embodiment extends outwardly to expose a portion of resistivity areas 42.

The doping material implanted in substrate structure 30 at area 42 is annealed at a temperature less than approximately 400° C. and preferably in a range of approximately 350° C. to 400° C., to reduce reverse leakage current. It has been found that this amount of anneal aids in substantially reducing reverse leakage current while not affecting other components. It will of course be understood that the various steps of forming and patterning dielectric layer 45 and the annealing of the doping material can be performed in any convenient order.

Schottky metal 50 is deposited on surface 33 of substrate structure 30 through contact opening 46 in dielectric layer 45 and dielectric film 35 to form a Schottky contact, illustrated in FIG. 5. In this specific embodiment the metal used for the Schottky contact is Ti/Al, Ni/Al, or the like. The surface of the device, or wafer if a number of devices are being fabricated simultaneously, is metalized with the Schottky metal and the layer is patterned in any of the standard semiconductor techniques, such as lift off, etch, etc.

It has been found that a large electric field is formed at the edge of dielectric layer 45, which causes premature breakdowns. Thus, in this specific embodiment areas 42 are formed to lie beneath the edges of dielectric layer 45 to improve the breakdown characteristics of the Schottky contact. Also, the extent (lateral dimension) of each of the areas 42 is limited, which achieves high breakdown voltage while significantly lowering reverse leakage current. Further improvement in the Schottky contact characteristics is obtained by using a field plate (dielectric layer 45) in conjunction with a damage ring (areas 42). The field plate provides passivation as well as improved depletion layer contouring. In addition to the field plate width and the thickness of the dielectric layer (areas 33 and 45), breakdown voltage of the Schottky contact is also controlled by the relative placement of the damage ring and the field plate edge, as described above.

Figure 6:
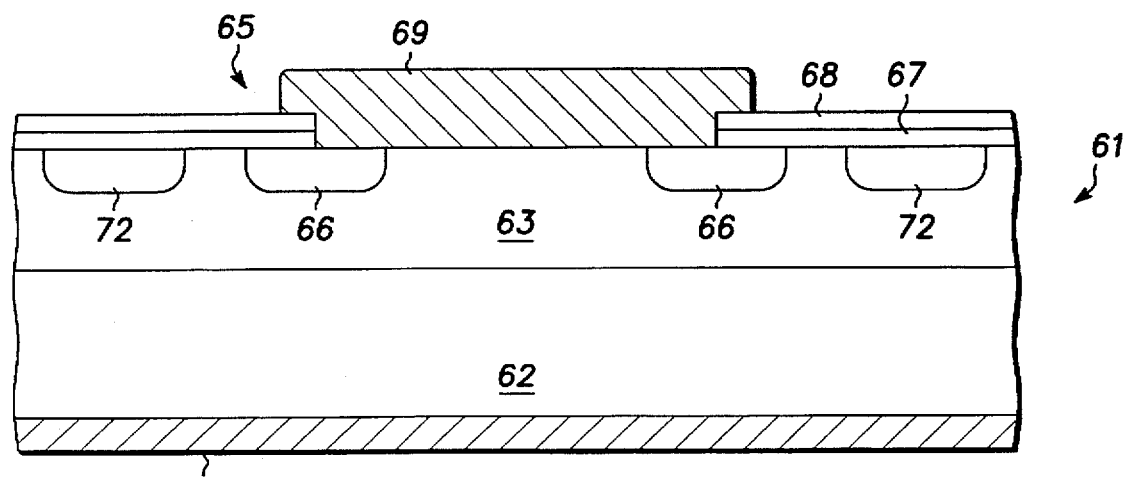
FIG. 6 is a simplified cross-sectional view of a semiconductor device in accordance with the present invention.

Referring specifically to FIG. 6, a simplified cross-sectional view is illustrated of a semiconductor device 60 in accordance with the present invention. A substrate structure 61 is provided having a substrate 62 with a lightly doped epitaxial layer 63 positioned thereon. A second contact 64 is provided on the lower surface of substrate 62, generally as previously described. Device 60 includes a Schottky contact 65 formed as described above with implanted areas 66, dielectric film 67, dielectric layer 68, and Schottky metal contact 69.

Device 60 clearly illustrates the limitations on the extent of implanted areas 66 relative to dielectric film 67 and dielectric layer 68. Also, as explained above the field plate (dielectric layer 68) provides passivation of device 60 as well as improved depletion layer contouring. Further, in addition to the width (lateral extent) of Schottky metal contact 69 over dielectric layer 68 and the thickness of dielectric film 67 and dielectric layer 68, breakdown voltage of Schottky contact 65 is controlled by the relative placement of areas 66 (the damage ring) and the edge of dielectric layer 68.

In addition to implanted areas 66 positioned beneath the edges of dielectric layer 68 at Schottky contact 65, implanted areas 72 are formed laterally outwardly from Schottky contact 65. Implanted areas 72 may be, for example, an additional damage ring spaced from the damage ring formed by implanted areas 66. Additional damage rings optimally positioned around Schottky contact 65 may be used to provide a linear contouring of the depletion layer. It should be understood that while contact 69 is terminated in overlying relationship to implanted areas 66, it could extend to implanted area 72, if desired.

Thus, improved fabrication processes are disclosed which incorporate improved damage rings or areas and improved field plates. The improved fabrication processes are especially useful for the manufacturing of Schottky diodes or contacts and semiconductor devices incorporating Schottky diodes or contacts. The novel combination of damage ring or rings and a field plate substantially improves the breakdown characteristics of the semiconductor devices and can be used for contouring the depletion layer.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a semiconductor device comprising the steps of:

providing a semiconductor substrate structure having first and second surfaces;

forming a dielectric film on the first surface of the substrate structure with spaced apart openings therethrough;

implanting doping material in the substrate structure through the spaced apart openings to form spaced apart high resistivity areas;

depositing a dielectric layer on the dielectric film;

forming a contact opening through the dielectric layer and the dielectric film exposing a portion of the first surface of the substrate structure, the contact opening being positioned at least partially between the spaced apart high resistivity areas;

annealing the doping material implanted in the substrate structure to reduce reverse leakage current; and depositing a metal contact on the first surface of the substrate structure through the contact opening in the dielectric layer and the dielectric film.

2. A method of fabricating a semiconductor device as claimed in claim 1 wherein the step of providing the semiconductor substrate structure includes providing a substrate structure of silicon carbide (SiC).

3. A method of fabricating a semiconductor device as claimed in claim 2 wherein the step of forming the dielectric film includes growing an oxide film.

4. A method of fabricating a semiconductor device as claimed in claim 3 wherein the step of growing the oxide film includes growing an oxide film approximately 500 angstroms thick.

5. A method of fabricating a semiconductor device as claimed in claim 3 wherein the step of forming the oxide film further includes patterning the oxide film to define spaced apart openings therethrough.

6. A method of fabricating a semiconductor device as claimed in claim 5 wherein the step of patterning the oxide film includes etching the oxide film with low power reactive ion etch.

7. A method of fabricating a semiconductor device as claimed in claim 5 including in addition a step of forming an electrical contact on the second surface of the substrate structure prior to the step of implanting doping material.

8. A method of fabricating a semiconductor device as claimed in claim 7 wherein the step of forming the electrical contact on the second surface includes depositing a layer of Ni on the second surface.

9. A method of fabricating a semiconductor device as claimed in claim 7 wherein the step of forming the electrical contact on the second surface includes annealing the electrical contact at a temperature greater than 900° C.

10. A method of fabricating a semiconductor device as claimed in claim 1 wherein the step of implanting doping material includes implanting one of argon or krypton.

11. A method of fabricating a semiconductor device as claimed in claim 1 wherein the step of depositing the dielectric layer on the dielectric film includes depositing a layer of silicon nitride on the dielectric film.

12. A method of fabricating a semiconductor device as claimed in claim 1 wherein the step of annealing the doping material includes annealing at a temperature less than approximately 400° C. for approximately 5 minutes.

13. A method of fabricating a semiconductor device as claimed in claim 1 wherein the step of depositing a metal contact on the first surface of the substrate structure through the contact opening includes depositing a layer of metal including one of Ti/Al and Ni/Al.

14. A method of fabricating a semiconductor device as claimed in claim 1 wherein the semiconductor device includes a Schottky diode and the step of depositing a metal contact includes forming a Schottky contact.

15. A method of fabricating a semiconductor device as claimed in claim 1 wherein the step of implanting doping material in the substrate structure through the spaced apart openings to form spaced apart high resistivity areas includes forming a plurality of spaced apart high resistivity areas in the substrate structure surrounding the contact opening.

16. A method of fabricating a semiconductor device including a Schottky diode comprising the steps of:

providing a silicon carbide substrate structure having first and second surfaces;

forming an ohmic contact on the second surface of the substrate structure by depositing a layer of metal and annealing at a temperature above 900° C.;

growing a dielectric film on the first surface of the substrate structure and patterning the dielectric film to define spaced apart openings therethrough;

implanting doping material in the substrate structure through the spaced apart openings to form spaced apart high resistivity areas;

depositing a dielectric layer on the dielectric film and forming a contact opening through the dielectric layer and the dielectric film exposing a portion of the first surface of the substrate structure, the contact opening being positioned at least partially between the spaced apart high resistivity areas;

annealing the doping material implanted in the substrate structure at a temperature less than approximately 400° C. to reduce reverse leakage current; and depositing metal on the first surface of the substrate structure through the contact opening in the dielectric layer and the dielectric film to form a Schottky contact.

* * * * *